United States Patent [19]

Shinn

[11] 4,246,080

[45] Jan. 20, 1981

[54] SOLAR-ENERGY-PROCESS-CONVERTER SYSTEM

[76] Inventor: William A. Shinn, 26511 Palisades Dr., Capistrano Beach, Calif. 92624

[21] Appl. No.: 60,296

[22] Filed: Jul. 25, 1979

[51] Int. Cl.[3] ............................ C25B 1/04; C25B 9/00
[52] U.S. Cl. ........................................ 204/129; 123/2;
123/3; 123/DIG. 12; 136/206; 136/246
[58] Field of Search ..................... 204/129; 123/2-3,
123/DIG. 12; 136/89 PC, 206; 60/641

[56] References Cited

U.S. PATENT DOCUMENTS

| 1,581,944 | 4/1926 | Hausmeister | 204/129 |
| 2,365,330 | 12/1944 | Carmichael | 123/DIG. 12 |
| 3,459,953 | 8/1969 | Hughes et al. | 204/129 |
| 4,021,323 | 5/1977 | Kilby et al. | 204/129 |
| 4,023,545 | 5/1977 | Mosher et al. | 123/3 |

FOREIGN PATENT DOCUMENTS

2520044  11/1976  Fed. Rep. of Germany ........... 204/129

OTHER PUBLICATIONS

"Sun" Procds. Int'l. Solar Energy Soc. Congress, New Delhi, India 1/78, B. Slater et al., pp. 1271-1277.

*Primary Examiner*—R. L. Andrews
*Attorney, Agent, or Firm*—Francis X. LoJacono

[57] ABSTRACT

A solar-energy-process-converter system whereby the energy from the sun is accumulated and projected by a parabolic reflector so as to impinge upon a cluster of thermocouples to create electrical energy for activating an electrolysis unit through which hydrogen and oxygen are generated and stored. The system can also include a steam-turbine electrical-generator plant that is adapted to be operated by the burning of the hydrogen and oxygen, and the gases can further be used to establish heat to drive a thermocouple electrical-generator plant, wherein the stored hydrogen is further employed as a fuel for vehicle and other engines.

1 Claim, 3 Drawing Figures

SOLAR-ENERGY-PROCESS-CONVERTER SYSTEM

BACKGROUND OF THE INVENTION

1. Field of the Invention

This invention relates to a means by which the energy from the sun is converted into a continuous supply of electricity so as to generate hydrogen and oxygen gases, whereby electrical power and fuel comprise the end result thereof.

2. Description of the Prior Art

The method of electrolysis is well established in the art. During the electrolysis of water, oxygen is liberated at the anode, while hydrogen is liberated at the cathode. To the applicant's knowledge, the solar generation of electricity through thermocouples is a new and unique method offering low-cost energy to supply a continuous flow of negative and positive electrons to generate an electrolysis of water which—in turn—produces hydrogen and oxygen.

SUMMARY AND OBJECTS OF THE INVENTION

The present invention has for an important object a provision wherein the sun's energy is collected and projected to a cluster of thermocouples to generate enough electrical current to drive a water-electrolysis unit, through which hydrogen and oxygen gases are created and stored for processing.

It is another object of the invention to provide a method of this type that allows the stored gases to be further converted into electrical energy by means of either a steam turbine generating plant or a thermocouple-generating plant.

It is still another object of the invention to provide a method of this type that allows the hydrogen and oxygen gases to be generated for use as fuel for vehicle or other engines.

It is further an object that a pressurized hydrogen gas be used for automotive fuel in conjunction with a variable mixture of oxygen to control the magnitude of the force of combustion.

It is a further object of the invention to provide a method of this character that facilitates service and maintenance, and which makes it relatively inexpensive to operate and produce large continuous quantities of hydrogen and oxygen gases, without the need for fuel oils that are now becoming depleted.

It is still a further object of the invention to provide a method of this character that also permits the use of hydrogen produced by solar power to replace natural gas and the resultant modifications required for its use.

The characteristics and advantages of the invention are further sufficiently referred to in connection with the accompanying drawings, which represent one embodiment. After considering this example, skilled persons will understand that variations may be made without departing from the principles disclosed; and I contemplate the employment of any structures, arrangements or mades of operation that are properly within the scope of the appended claims.

BRIEF DESCRIPTION OF THE DRAWINGS

Referring more particularly to the accompanying drawings, which are for illustrative purposes only.

DESCRIPTION OF THE PREFERRED EMBODIMENT

Figure 1:
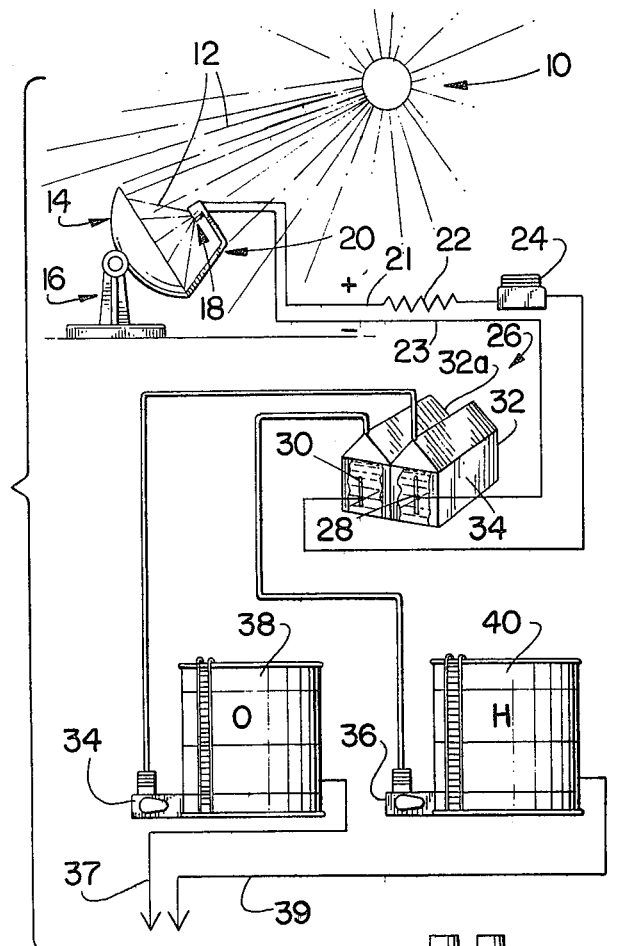
FIG. 1 is a schematic pictorial view of the basic method showing the sun being reflected to impinge upon a cluster of thermocouples which are connected electrically to a water-electrolysis unit having piping leading therefrom to two separate storage tanks.
Figure 2:
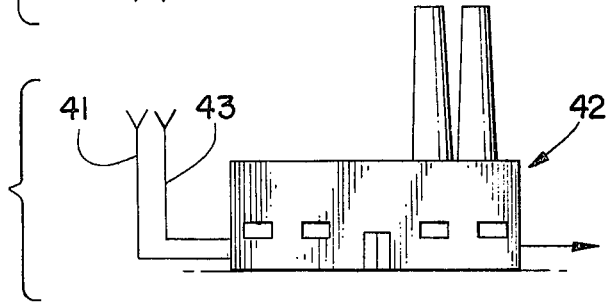
FIG. 2 is a diagram representing a steam-turbine plant to generate an electrical output.

Referring more particularly to FIG. 1, there is shown diagrammatically the sun, indicated at 10, shining its rays of energy 12 so as to be received by a parabolic reflector 14 of any suitable type. It is contemplated that such a reflector 14 would be provided with a tracking means, generally indicated at 16, that allows the rays 12 from the sun 10 to be directly received in a continuous manner during the movement of the sun, and projected to impinge accurately upon a solar-energy cell defined herein as a cluster of thermocouples, indicated at 18. The thermocouples are also arranged to be angularly displaced with the movement of the parabolic reflector 14; and, thus, the thermocouples include angular adjusting means 20 synchronized with the movement of reflector 14.

Accordingly, the sun's rays are condensed, creating sufficient heat to activate thermocouples 18 to generate electrical current. The positive current flow 21 is connected to a voltage booster 22 which, in turn, passes through a voltage regulator 24 —whereby between 1 and 10 volts are provided therefrom and supplied to a water-electrolysis unit, generally indicated at 26. The negative current 23 flows directly from thermocouples 18 to the electrolysis unit 26 wherein the negative charge is connected to an electrode 28, while the positive charge is established through a second electrode 30. Thus, as is well known in the art, when an electrode such as 30 is connected to the positive terminal of a source of current, it is called an anode, the anode thus being positively charged. The other electrode such as 28 is called the cathode, it being connected to the negative terminal having a negative charge.

Various numbers of electrodes can be employed and are positioned within electrolysis cells which are defined by vessels or tanks 32 in which the electrolysis occurs and wherein the electrolyte 34 is stored, the electrolyte being water ($H_2O$) which is naturally composed of hydrogen and oxygen.

When electric current is passed through water, the water ionizes and releases positively charged hydrogen ions, negatively charged hydroxide ions, and negatively charged sulfate ions, from the acid in the water. Since charges of unlike signs attract, the cathode will attract the hydrogen ions, and the anode will attract both the sulfate ions and the hydroxide ions.

When the hydrogen ions reach the cathode, they extract electrons from it, and thus become bubbles of neutral hydrogen gas which escape from the solution.

At the anode, either the sulfate ions or the hydroxide ions can be discharged and release their electrons, whereby oxygen gas bubbles are produced.

The electrolysis unit 26 as seen in FIG. 1 is arranged to collect the two gases. The hydrogen is accumulated in tank 32a above the cathode 30, and oxygen bubbles are accumulated in tank 32 above the anode 28. As the oxygen and hydrogen are collected, they are each separately pumped by compressor pumps 34 and 36, respectively, into respective storage tanks 38 and 40. Here, the gases are stored until they are to be utilized.

However, it is further contemplated that each storage tank can be connected to supply the oxygen and hydrogen gases as fuel to activate a steam-turbine electricity-generating plant, indicated at 42, whereby electricity is provided in a well known manner. The connection would be made between the output lines 37 and 39 of the oxygen and hydrogen tanks, and the input lines 41 and 43 of the steam-turbine electricity-generating plant 42.

Figure 3:
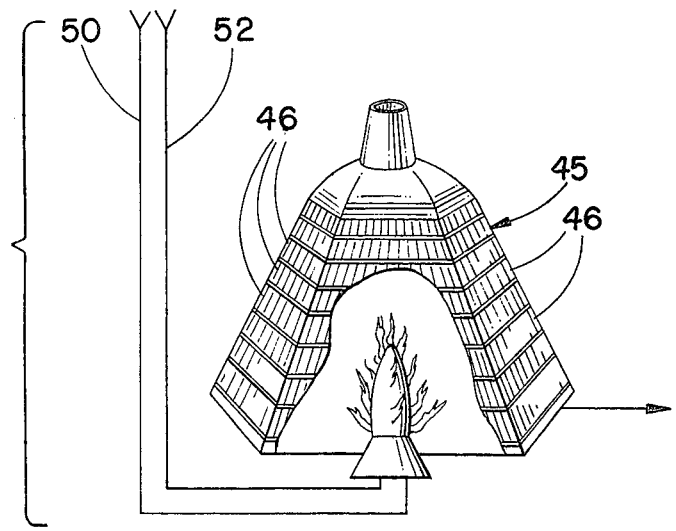
FIG. 3 is a diagram representing a thermocouple plant which also is activated by the burning of the gases to provide electrical energy therefrom.

Other means of employing the gases of hydrogen and oxygen are also contemplated, and one is shown in FIG. 3 as a thermocouple-generating plant, designated at 45, having a multiplicity of thermocouple units 46 which are activated by a burner means 48 which is provided with a continuous flow of the two gases from their respective tanks. That is, incoming gas lines 50 and 52 would need only to be connected to output lines 37 and 39 of the respective storage tanks 38 and 39.

Thus, by the use of the present method, solar energy can be readily converted to a known form of electrical energy which is most needed.

It should be further understood that the hydrogen as stored in tank 40 can also supply the necessary means to fuel vehicles and other operating devices, in order to supply hydrogen to replace natural gas and to provide oxygen for medical and miscellaneous purposes.

The invention and its attendant advantages will be understood from the foregoing description; and it will be apparent that various changes may be made in the form, construction and arrangement of the parts of the invention without departing from the spirit and scope thereof or sacrificing its material advantages, the arrangement hereinbefore described being merely by way of example; and I do not wish to be restricted to the specific form shown or uses mentioned, except as defined in the accompanying claims.

I claim:

1. A method of converting the rays of energy from the sun into a continuous supply of hydrogen and oxygen gases, comprising the steps of:

providing a parabolic reflector arranged to follow the movement of the sun in order to receive the rays of energy directly from the sun;

providing said parabolic reflector with means for tracking the movement of the sun;

projecting said rays from said parabolic reflector to impinge upon a cluster of thermocouples, thereby creating electrical energy;

angularly adjusting said cluster of thermocouples provided by an adjusting means to synchronize the movement of said thermocouples with the movement of said reflector as said reflector turns with the movement of the sun;

causing said cluster of thermocouples to generate positive and negative current flow;

providing an electrolysis unit having water as an electrolyte;

activating said electrolysis unit by connecting said cluster of thermocouples thereto, so as to generate hydrogen and oxygen gases therein;

providing a voltage booster and a voltage regulator within the positive current flow, whereby voltage received by said electrolysis unit is between one and ten volts; and pumping said gases to separate storage tanks.

* * * * *